US006437666B1

(12) United States Patent
Matsumura et al.

(10) Patent No.: US 6,437,666 B1
(45) Date of Patent: Aug. 20, 2002

(54) MONOLITHIC LC RESONATOR AND MONOLITHIC LC FILTER WITH TUBULAR INDUCTOR

(75) Inventors: Sadayuki Matsumura, Takefu; Noboru Kato, Sabae, both of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/659,220

(22) Filed: Sep. 11, 2000

(30) Foreign Application Priority Data

Sep. 10, 1999 (JP) .......................................... 11-257981

(51) Int. Cl.[7] .................................................. H03H 7/01

(52) U.S. Cl. ....................................... 333/185; 333/184

(58) Field of Search ................................ 333/175, 184, 333/185

(56) References Cited

U.S. PATENT DOCUMENTS 4,904,967 A * 2/1990 Morll et al. ................ 333/185
6,114,925 A * 9/2000 Lo ............................ 333/185

* cited by examiner

*Primary Examiner*—Justin P. Bettendorf
(74) *Attorney, Agent, or Firm*—Keating & Bennett, LLP

(57) ABSTRACT

An LC resonator includes insulation sheets and inductor patterns that are electrically connected through long via-holes provided in insulation sheets, so that tubular structures each having an insulator material disposed therein and having a substantially rectangular cross section are produced. The tubular structures are laminated through sheets to define an inductor having a double structure. A capacitor pattern is opposed to the open ends of the inductor patterns, respectively, to produce a capacitor. That is, the capacitor pattern is arranged between the tubular structures. The capacitor and the inductor having the double structure define an LC parallel resonance circuit.

20 Claims, 10 Drawing Sheets

MONOLITHIC LC RESONATOR AND MONOLITHIC LC FILTER WITH TUBULAR INDUCTOR

BACKGROUND OF THE INVENTION

1. Field of the Invention

The present invention relates to a monolithic LC resonator and a monolithic LC filter, and more particularly, to a monolithic LC resonator and a monolithic LC filter for use in a high frequency wave band.

2. Description of the Related Art

FIGS. 16 and 17 show an example of a conventional monolithic LC resonator. As shown in FIG. 13, an LC resonator 100 includes a ceramic sheet 104 having a capacitor pattern 112 provided on the upper surface thereof, a ceramic sheet 105 having an inductor pattern 111 provided on the upper surface thereof, a ceramic sheet 106 having an input capacitor pattern 115 and an output capacitor pattern 116 provided on the upper surface thereof, ceramic sheets 102 and 108 having shield electrodes 113 and 114 provided on the upper surfaces thereof, respectively.

The ceramic sheets 101 to 108 are stacked, and fired to produce a laminate 110 shown in FIG. 17. On the laminate 110, an input terminal 121, an output terminal 122, and ground terminals 123 and 124 are provided. The input capacitor pattern 115 is connected to the input terminal 121. The output capacitor pattern 116 is connected to the output terminal 122. To the ground terminal 123, the lead-out portion of the inductor pattern 111, and one end of the shield electrodes 113 and 114 are connected. The lead-out portion of the capacitor pattern 112 and the other end of the shield electrodes 113 and 114 are connected to the ground terminal 124.

In the above-described LC resonator 100, an inductor including the inductor pattern 111, and a capacitor including a capacitor pattern 112 opposed to the open end of the inductor pattern 111 define an LC parallel resonance circuit. The LC parallel resonance circuit is electrically connected to the input terminal 121 via a coupling capacitor including an inductor pattern 111 and the input capacitor pattern 115 opposed to each other. Similarly, the LC parallel resonance circuit is electrically connected to the output terminal 122 via a coupling capacitor including the inductor pattern 111 and the output capacitor pattern 116 opposed to each other.

The characteristics of the LC resonator depend on the Q value of the inductor in the resonance circuit. The Q value of the inductor is expressed as $Q=2\pi f_0 L/R$, in which L is the inductance of the inductor, R is the resistance of the inductor, and $f_0$ is the resonance frequency. As seen in this formula, the Q value of the inductor can be increased by decreasing the resistance R of the inductor. The inductance R is inversely proportional to the cross section of the inductor pattern 111. Hence, the Q value is increased by increasing the cross section S of the inductor pattern 111.

However, where the thickness of the inductor pattern 111 is increased to increase the cross-section S of the inductor pattern 111, the internal strain of the laminate 110 is substantially increased when the ceramic sheets 101 to 108 are integrally fired, resulting in delamination and other problems.

Further, a magnetic field generated in the periphery of the inductor pattern 111 is concentrated on the edge of the inductor pattern 111, causing a large eddy current loss. Moreover, in the conventional LC resonator 100, the magnetic field generated in the periphery of the inductor pattern 111 is interrupted by the capacitor pattern 112. Thus, the inductance L of the inductor is very low.

As described above, with the conventional LC resonator 100, it is difficult to attain a high Q value because the resistance R of the inductor pattern 111 constituting the LC resonance circuit is large, and moreover, the inductance L is low.

SUMMARY OF THE INVENTION

To overcome the above-described problems, preferred embodiments of the present invention provide a monolithic LC resonator and a monolithic LC filter each including an inductor having a high Q value.

According to a preferred embodiment of the present invention, a monolithic LC resonator includes a laminated body including an insulation layer, an inductor pattern, and a capacitor pattern laminated together, an LC resonance circuit provided in the laminated body includes an inductor defined by the inductor pattern, and a capacitor arranged such that the capacitor pattern is opposed to the inductor pattern with the insulation layer being sandwiched between the capacitor pattern and the inductor pattern. In the monolithic LC resonator, the inductor of the LC resonance circuit has a multi-layer structure in which a plurality of tubular structures are laminated to each other through the insulation layer, each of the plurality of tubular structures is defined such that at least two inductor patterns are electrically connected to each other through a via-hole provided in the insulation layer, and the capacitor pattern is arranged between the two tubular structures of the inductor.

Further, according to another preferred embodiment of the present invention, a monolithic LC filter includes a laminated body including a plurality of insulation layers, a plurality of inductor patterns, and a plurality of capacitor patterns laminated together, a plurality of LC resonators provided in the laminated body includes a plurality of inductors defined by the inductor patterns, and a plurality of capacitors arranged such that the capacitor patterns are opposed to the inductor patterns with the insulation layers being sandwiched between the capacitor patterns and the inductor patterns. In the monolithic LC filter, the inductor of each LC resonator has a multi-layer structure in which a plurality of tubular structures are laminated to each other through an insulation layer, each of the plurality of tubular structures is arranged such that at least two inductor patterns are electrically connected to each other through a via-hole provided in the insulation layer, and at least one of the capacitor pattern and a coupling capacitor pattern for capacitance-coupling the LC resonators is arranged between the tubular structures of the inductor.

The inductor preferably includes the plurality of tubular structures. The surface area of the inductor can be increased without increasing the thickness of the inductor pattern. In general, high frequency current has the properties that it is concentrated onto the surface of a conductor to flow, due to the skin effect. Because of this property, the entire inductor, of which the surface area is greatly increased, is effectively used as a path for high frequency current. Accordingly, the resistance of the inductor is significantly decreased as compared with that of a conventional inductor, and the Q value of the inductor is greatly improved.

A magnetic field generated with high frequency current flowing through the inductor does not substantially pass between the plural tubular structures constituting the inductor. Accordingly, the capacitor pattern and the coupling capacitor pattern for capacitance-coupling the resonators arranged between the two adjacent tubular structures in the laminating direction of the laminated body do not interfere with the magnetic field of the inductor.

Further, the inductor has the plurality of tubular structures, and the plurality of tubular structures are laminated through an insulation layer to define a multi-layer structure, which reduces the concentration of a magnetic field generated in the periphery of the inductor, on the edges of the inductor pattern.

Other features, elements, characteristics and advantages of preferred embodiments of the present invention will become apparent from the following detailed description of preferred embodiments thereof with reference to the attached drawings.

DETAILED DESCRIPTION OF PREFERRED EMBODIMENTS

Hereinafter, preferred embodiments of the monolithic LC resonator and the monolithic LC filter of the present invention will be described with reference to the accompanying drawings.

Figure 1:
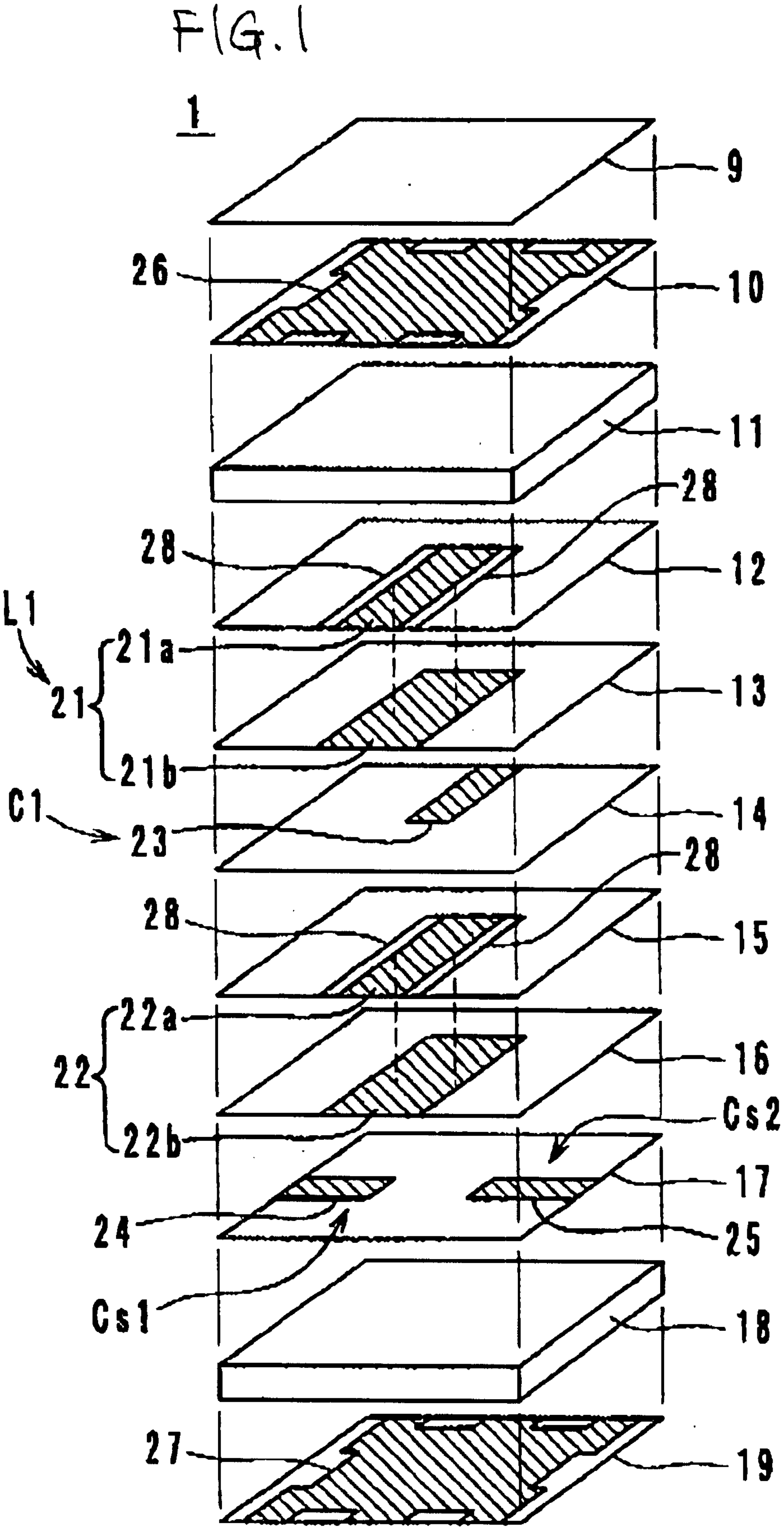
FIG. 1 is an exploded perspective view showing the configuration of a monolithic LC resonator according to a preferred embodiment of the present invention.
Figure 2:
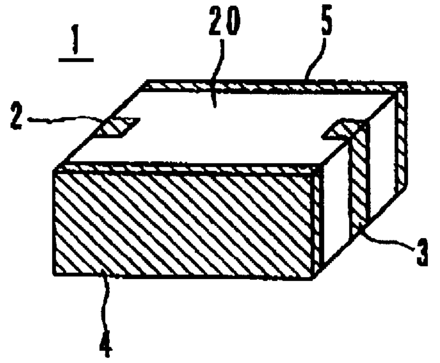
FIG. 2 is a perspective view showing the appearance of the monolithic LC resonator of FIG. 1.
Figure 4:
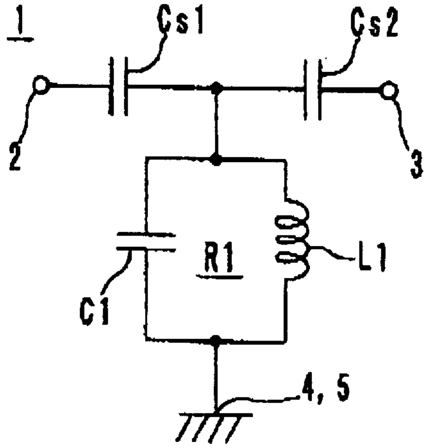
FIG. 4 is an electrical equivalent circuit diagram of the monolithic LC resonator of FIG. 2.

FIG. 1 shows the configuration of a monolithic LC resonator 1. FIGS. 2 and 4 are a perspective appearance view of the LC resonator 1 and an electrical equivalent circuit diagram thereof. The LC resonator 1 includes an LC parallel resonance circuit R1 including an inductor L1 and a capacitor C1. The LC parallel resonance circuit R1 is electrically connected between an input terminal 2 and an output terminal 3 via coupling capacitors Cs1 and Cs2, respectively.

As shown in FIG. 1, the resonator 1 includes insulation sheets 12, 13, 15, and 16 having inductor patterns 21*a*, 21*b*, 22*a*, and 22*b* provided thereon, respectively, an insulation sheet 14 having a capacitor pattern 23 provided thereon, an insulation sheet 17 having an input lead-out pattern 24 and an output lead-out pattern 25 provided thereon, and insulation sheets 10 and 19 having shield patterns 26 and 27 thereon, respectively. The insulation sheets 9 to 19 are produced by kneading dielectric powder or magnetic powder together with a binder or other suitable material, and forming this material into sheets, respectively. The patterns 21*a* to 27 are preferably made of Ag, Pd, Cu, Ni, Au, Ag—Pd, or other suitable material, and are produced by printing or other suitable method, respectively.

The linear inductor patterns 21*a*, 21*b*, 22*a*, and 22*b* each having a constant width are provided in the approximate central portions of the sheets 12, 13, 15, and 16. One end of each of the linear inductor patterns 21*a*, 21*b*, 22*a*, and 22*b* is exposed on the front sides as viewed in FIG. 1 of the sheets 12, 13, 15, and 16, respectively. The inductor patterns 21*a* and 21*b* are electrically connected to each other through long via-holes 28 provided in the sheet 12. The long via-holes 28 are disposed along the right edge and left edge as viewed in FIG. 1 of the inductor pattern 21*a*. The inductor patterns 21*a*, 21*b*, and the long via-holes 28 define a tubular structure 21 having a substantially rectangular cross-section and provided with the insulator filled therein, as shown in the cross-sectional view of FIG. 3.

Similarly, the inductor patterns 22*a* and 22*b* are electrically connected to each other through long via-holes 28 provided in the sheet 15. The inductor patterns 22*a* and 22*b*, and the long via-holes 28 define a tubular structure 22. The tubular structures 21 and 22 have substantially the same shape and size, and are laminated through the insulation sheets 13 and 14 to define a double structure inductor L1.

The capacitor pattern 23 is arranged in the approximate center and rear, as viewed in FIG. 1, of the sheet 14, and one end of the pattern 23 is exposed on the rear side of the sheet 14. The capacitor pattern 23 is disposed between the tubular structures 21 and 22 in the laminating direction of the sheets 9 to 19. The capacitor pattern 23 is opposed to the open end of the inductor pattern 21*b* and 22*a* through the sheets 13 and 14, respectively, to define a capacitor C1. The capacitor C1 and the double structure inductor L1 define the LC parallel resonance circuit R1.

The input and output capacitor patterns 24 and 25 are provided on the right side and left side of the sheet 17, respectively. One end of the input capacitor pattern 24 is exposed onto the left side of the sheet 17, and the other end of the input capacitor pattern 24 is opposed to the inductor pattern 22*b* with the sheet 16 being sandwiched therebetween to define the coupling capacitor Cs1. One end of the output capacitor pattern 25 is exposed on the right side of the sheet 17, and the other end of the output capacitor pattern 25 is opposed to the inductor pattern 22*b* with the sheet 16 being sandwiched therebetween to define the coupling capacitor Cs2. The shield patterns 26 and 27 each having a wide area are disposed so as to sandwich the patterns 21*a* to 25. The shield patterns 26 and 27 are exposed to the front and rear sides of the sheets 9 and 19, respectively.

The respective sheets 9 to 19 having the above-described configurations are sequentially stacked, joined under pressure, as shown in FIG. 1, and fired integrally to produce a laminated body 20 shown in FIG. 2. On the right end and left end surfaces of the laminated 20, an input electrode 2 and an output electrode 3 are provided, respectively. Ground electrodes 4 and 5 are provided on the front and rear surfaces of the laminated body 20. One end of the input capacitor pattern 24 is connected to the input electrode 2, and one end of the output capacitor pattern 25 is connected to the output electrode 3. One end of the shield patterns 26, 27 and one end of the inductor patterns 21*a,* 21*b,* 22*a,* and 22*b* are connected to the ground electrode 4. The other end of the shield patterns 26 and 27, and one end of the capacitor pattern 23 are connected to the ground electrode 5.

Figure 3:
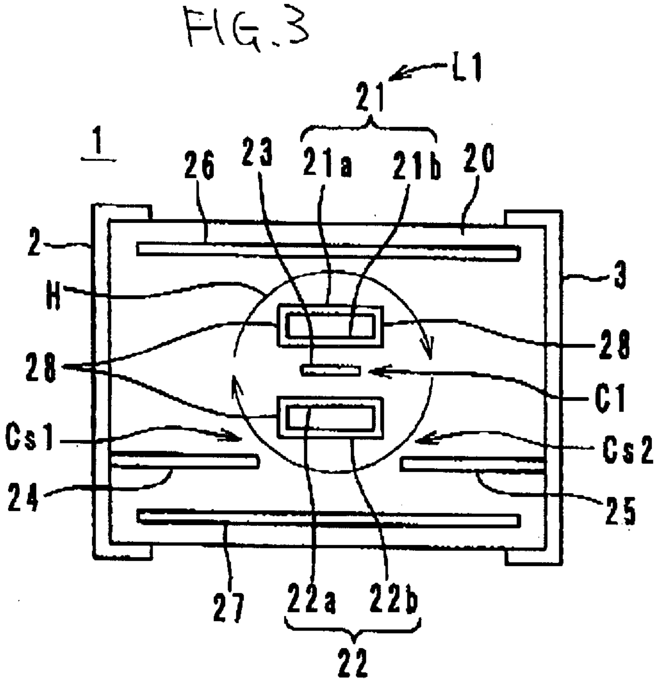
FIG. 3 is a schematic cross-sectional view of the monolithic LC resonator of FIG. 2.

In the monolithic resonator 1, the inductor L1 includes the tubular structure 21 including the inductor patterns 21*a* and 21*b,* and the long via-holes 28, and the tubular structure 22 including the inductor patterns 22*a* and 22*b,* and the long via holes 28, as shown in FIG. 3. The surface area of the inductor L1 is increased without increasing the thickness of the inductor patterns 21*a* to 22*b*. Generally, high frequency current flows so as to be concentrated onto the surface of a conductor, due to the skin effect. Accordingly, the entire inductor L1 having the wider surface area is effectively used as a path for the high frequency current. Thus, the resistance of the inductor L1 is reduced as compared with of a conventional inductor, so that the Q value of the inductor L1 is greatly improved.

A magnetic field H generated when high frequency current flows through the inductor L1 does not substantially flow between the tubular structures 21 and 22 that constitute the inductor L1. Accordingly, the capacitor pattern 23 disposed between the tubular structures 21 and 22 does not interrupt the magnetic field H of the inductor L1.

Further, the inductor L1 includes the two tubular structures 21 and 22, and the two tubular structures 21 and 22 are laminated through the insulation sheets 13 and 14 to have a double structure. This greatly reduces the concentration of the magnetic field H, generated in the periphery of the inductor L1, on the edges of the inductor patterns 21*a,* 21*b,* 22*a,* and 22*b*. As a result, a monolithic LC resonator 1 having a high Q value and excellent characteristics is produced.

Figure 5:
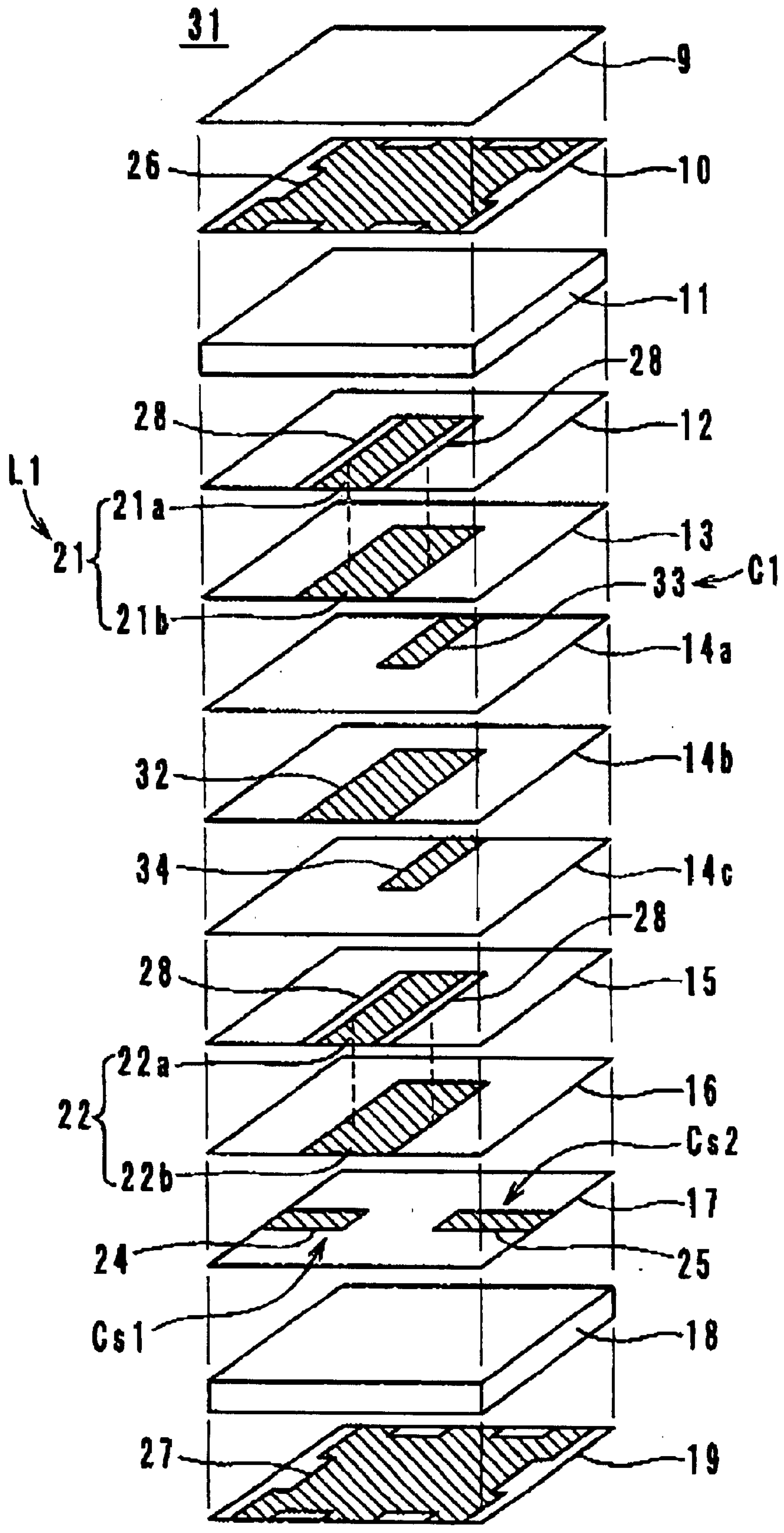
FIG. 5 is an exploded perspective view showing the configuration of the monolithic LC resonator according to another preferred embodiment of the present invention.

As shown in FIG. 5, a monolithic LC resonator 31 according to a second preferred embodiment is similar to the LC resonator 1 of the first preferred embodiment except that three insulation sheets 14*a,* 14*b,* and 14*c* are used instead of the insulation sheet 14. On the surfaces of the insulation sheets 14*a* and 14*c,* capacitor patterns 33 and 34 are provided, respectively. On the surface of the insulation sheet 14*b,* an inductor pattern 32 is provided. The elements of the second preferred embodiment corresponding to the elements shown in FIGS. 1 to 4 are designated by the same reference numerals, and the similar explanation is omitted.

Figure 6:
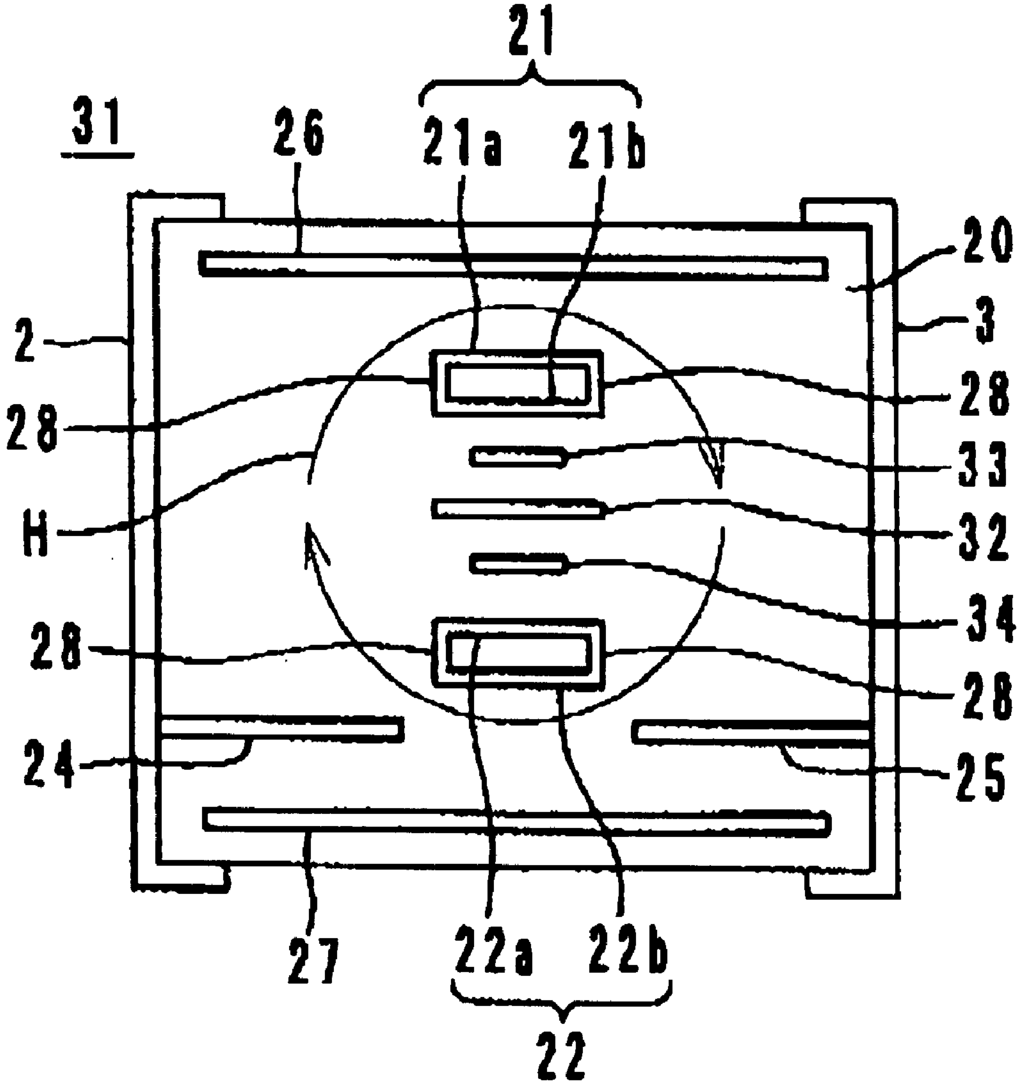
FIG. 6 is a schematic cross sectional view of the monolithic LC resonator of FIG. 5.

In the LC resonator 31, the inductor L1 has the triple structure that includes two tubular structures 21 and 22, and one inductor pattern 32, and thus, the skin effect for high frequency current is advantageously utilized. As shown in FIG. 6, the capacitor patterns 33 and 34 are arranged between the inductor pattern 32 and the tubular structures 21, 22, respectively. This configuration effectively suppresses the capacitor patterns 33 and 34 from interrupting the magnetic field H of the inductor L, enabling the inductor L1 to have a high Q value.

Figure 7:
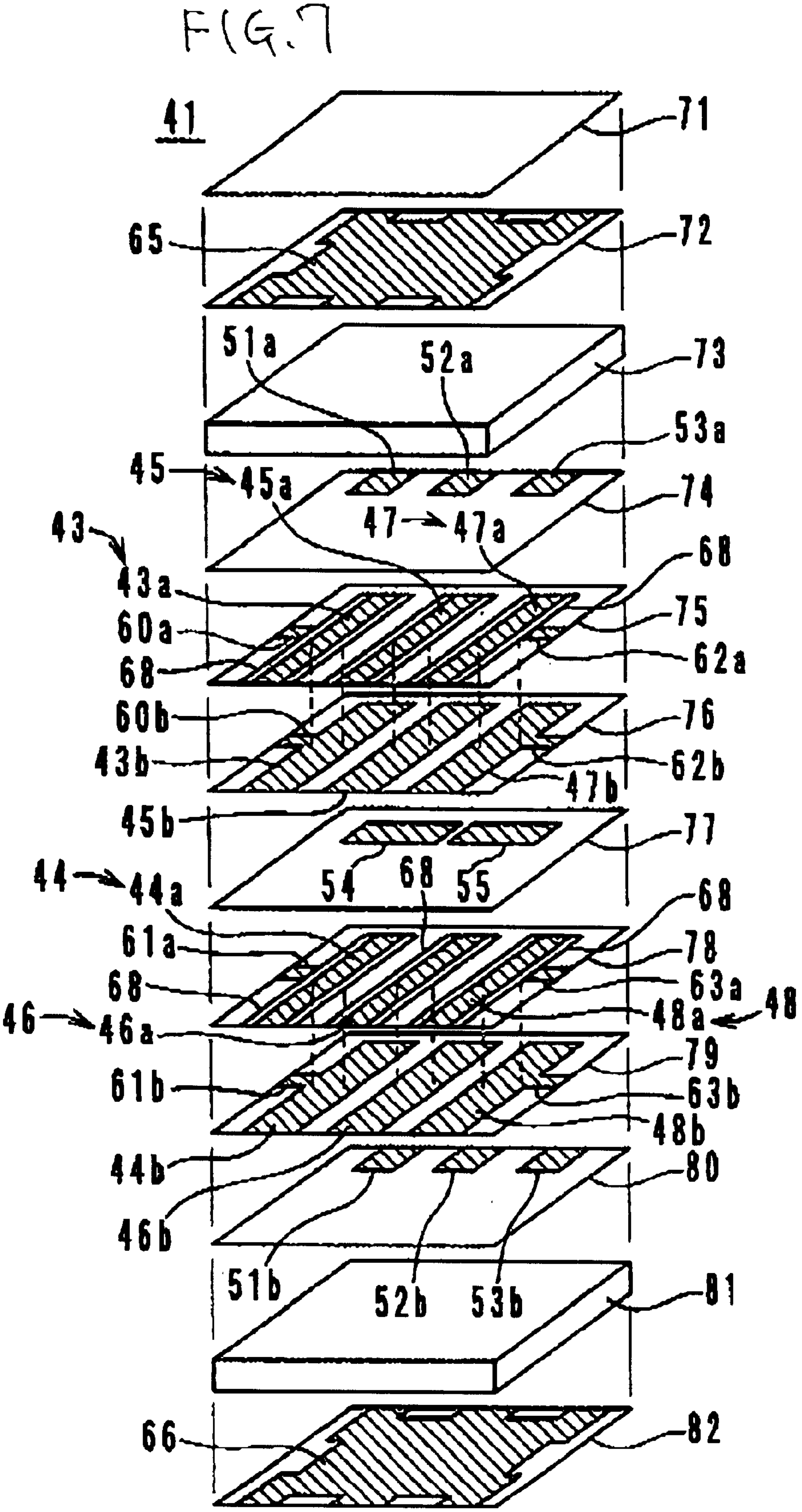
FIG. 7 is an exploded perspective view of the monolithic LC filter according to a preferred embodiment of the present invention.
Figure 8:
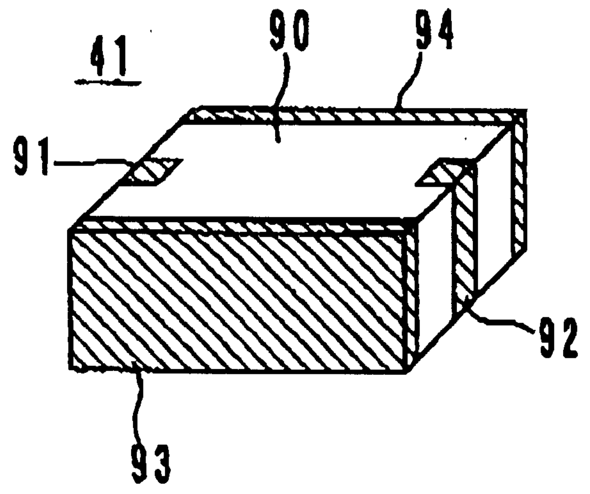
FIG. 8 is a perspective view showing the appearance of the monolithic LC filter of FIG. 7.
Figure 10:
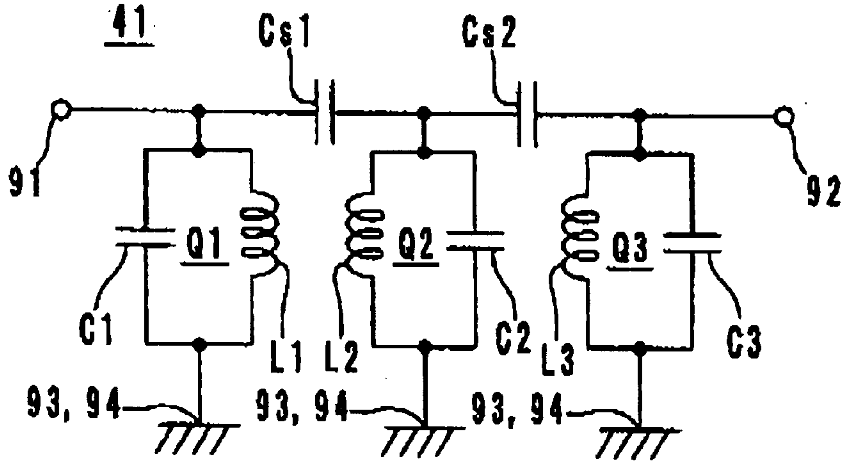
FIG. 10 is an electric equivalent circuit diagram of the monolithic LC filter of FIG. 8.

FIG. 7 shows the configuration of a monolithic LC filter 41. FIGS. 8 and 10 are a perspective appearance view and an electrically equivalent circuit diagram of the LC filter 41. In the third preferred embodiment, a band-pass filter as an example is described. The LC filter of the present invention may be a band-elimination filter or other suitable filter. The LC filter 41 is a three-stage LC band-pass filter. The LC resonator Q1 in the first (initial) stage, the LC resonator Q2 in the second stage, and the LC resonator Q3 in the third (final) stage are longitudinally connected via coupling capacitors Cs1 and Cs2, respectively.

As shown in FIG. 7, the LC filter 41 includes insulation sheets 75, 76, 78, and 79 having inductor patterns 43*a,* 45*a,* 47*a;* 43*b,* 45*b,* 47*b;* 44*a,* 46*a,* 48*a;* 44*b,* 46*b,* and 48*b* provided on the surfaces thereof, respectively, insulation sheets 74 and 80 having capacitor patterns 51*a,* 52*a,* 53*a;* 51*b,* 52*b,* and 53*b* provided on the surfaces thereof, respectively, an insulation sheet 77 having coupling capacitor patterns 54 and 55 provided on the surface thereof, and insulation sheets 72 and 82 having shield patterns 65 and 66 provided on the surfaces thereof respectively.

The linear inductor patterns 43*a,* 43*b,* 44*a,* and 44*b* are arranged on the left sides of the sheets 75, 76, 78, and 79, respectively. One end of the linear inductor patterns 43*a,* 43*b,* 44*a,* and 44*b* are exposed on the front sides of the sheets 75, 76, 78, and 79, respectively. The inductor patterns 43*a* and 43*b* are electrically connected to each other through long via-holes 68 provided in the sheet 75. The long via-holes 68 are disposed to connect the right edge and left edge of the inductor patterns 43*a* and 43*b,* respectively. The inductor patterns 43*a,* 43*b,* and the long via-holes 68 define a tubular structure 43 having the insulator filled therein and having a substantially rectangular cross section, as shown in the cross sectional view of FIG. 9.

The inductor patterns 44*a* and 44*b* are electrically connected to each other through long via-holes 68 provided in the sheet 78. The inductor patterns 44*a* and 44*b,* and the long via-holes 68 define a tubular structure 44. The tubular structures 43 and 44 have substantially the same shape and size, and are laminated through the sheets 76 and 77 to define a double structure inductor L1. Input lead-out patterns 60*a,* 60*b,* 61*a,* and 61*b* extend from the approximate centers of the inductor patterns 43*a,* 43*b,* 44*a,* and 44*b* are exposed on the left side of the sheets 75, 76, 78, and 79. The input lead-out patterns 60*a* and 60*b,* and the input leadout patterns 61*a* and 61*b* are electrically connected through long via-holes.

The linear inductor patterns 45*a,* 45*b,* 46*a,* and 46*b* are arranged in the approximate central portions of the sheets 75, 76, 78, and 79. One end of the linear inductor patterns 45*a,* 45*b,* 46*a,* and 46*b* are exposed on the front sides of the sheets 75, 76, 78, and 79, respectively. The inductor patterns 45*a* and 45*b* are electrically connected to each other through long via-holes 68 provided in the sheet 75. The inductor patterns 45*a,* 45*b,* and the long via-holes 68 define a tubular structure 45 having a substantially rectangular cross-section, as shown in the cross-sectional view of FIG. 9.

The inductor patterns 46*a* and 46*b* are electrically connected to each other through long via-holes 68 provided in the sheet 78. The inductor patterns 46*a* and 46*b,* and the long via-holes 68 define a tubular structure 46. The tubular structures 45 and 46 have substantially the same shape and size, and are laminated through the sheets 76 and 77 to define a double structure inductor L2.

Figure 9:
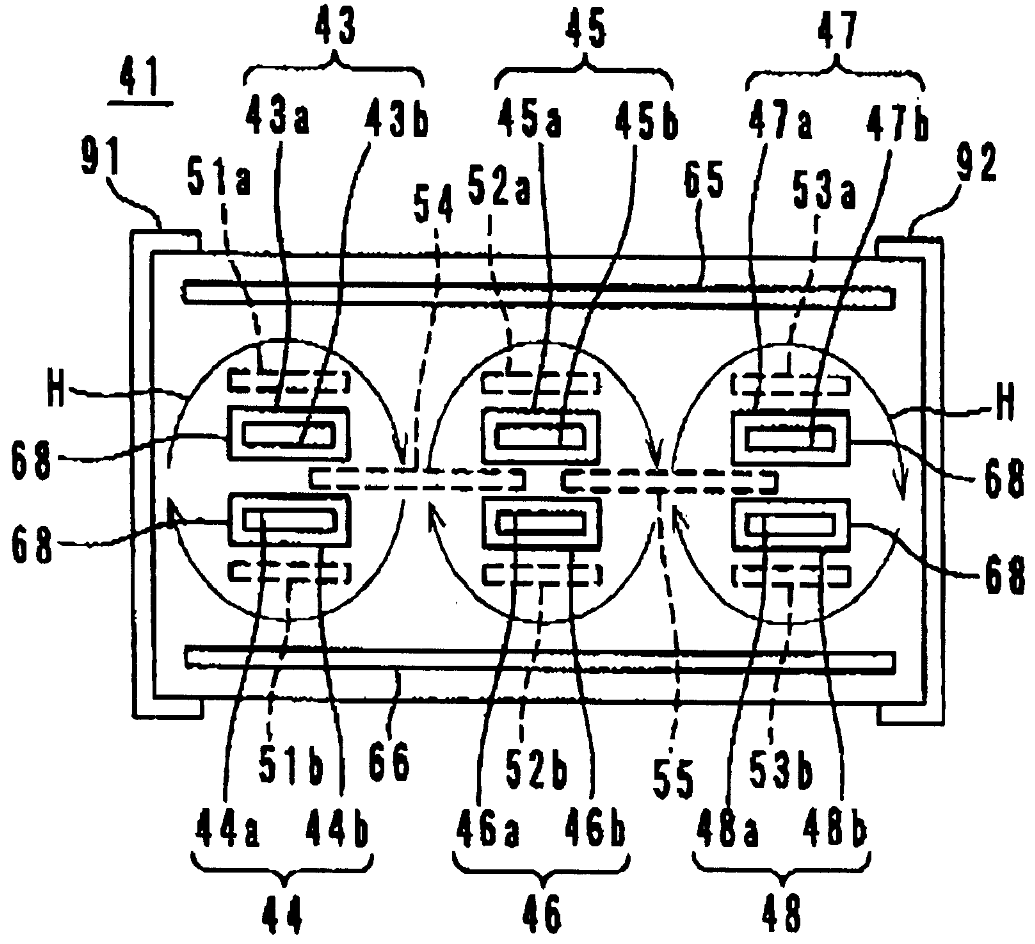
FIG. 9 is a schematic cross sectional view of the monolithic LC filter of FIG. 8.

The linear inductor patterns 47*a,* 47*b,* 48*a,* and 48*b* are provided on the right sides of the sheets 75, 76, 78, and 79, respectively. One end of the linear inductor patterns 47*a,* 47*b,* 48*a,* and 48*b* are exposed on the front sides of the sheets 75, 76, 78, and 79, respectively. The inductor patterns 47*a* and 47*b* are electrically connected to each other through long via-holes 68 provided in the sheet 75. The inductor patterns 47*a* and 47*b,* and the long via-holes 68 define a tubular structure 47 having a substantially rectangular cross-section, as shown in FIG. 9.

Also the inductor patterns 48*a* and 48*b* are electrically connected to each other through the long via-holes 68 provided in the sheet 78. The inductor patterns 48*a* and 48*b,* and the long via-holes 68 define a tubular structure 48. The tubular structures 47 and 48 have substantially the same shape and size, and are laminated through the sheets 76 and 77 to define a double structure inductor L3. Output lead-out patterns 62*a,* 62*b,* 63*a,* and 63*b* extended from the approximate central portions of the inductor patterns 47*a,* 47*b,* 48*a,* and 48*b* are exposed on the right side of the sheets 75, 76, 78, and 79. The output lead-out patterns 62*a* and 62*b,* and the output lead-out patterns 63*a* and 63*b* are electrically connected through long via-holes.

The capacitor patterns 51*a* and 51*b* are arranged in the rear left positions of the sheets 74 and 80, respectively. One end of the capacitor patterns 51*a* and 51*b* are exposed on the rear sides of the sheets 74 and 80, respectively. The inductor L1 having the double structure is arranged between the capacitor patterns 51*a* and 51*b* in the laminating direction of the sheets 71 to 82. The capacitor patterns 51*a* and 51*b* are opposed to the open ends of the inductor patterns 43*a* and 44*b* via the sheets 74 and 79, respectively, to define a capacitor C1. The capacitor C1 and the double structure inductor L1 constitute an LC parallel resonance circuit, that is, define the first stage LC resonator Q1.

The capacitor patterns 52*a* and 52*b* are arranged in the rear central positions of the sheets 74 and 80, respectively. One end of the capacitor patterns 52*a* and 52*b* are exposed on the rear sides of the sheets 74 and 80, respectively. The inductor L2 having the double structure is arranged between the capacitor patterns 52*a* and 52*b* in the laminating direction of the sheets 71 to 82. The capacitor patterns 52*a* and 52*b* are opposed to the open end of the inductor patterns 45*a* and 46*b* via the sheets 74 and 79, respectively, to define a capacitor C2. The capacitor C2 and the double structure inductor L2 constitute an LC parallel resonance circuit, that is, define the second stage LC resonator Q2.

The capacitor patterns 53*a* and 53*b* are arranged in the rear right portions of the sheets 74 and 80, respectively. One end of the capacitor patterns 53*a* and 53*b* are exposed on the rear sides of the sheets 74 and 80, respectively. The inductor L3 having the double structure is arranged between the capacitor patterns 53*a* and 53*b* in the laminating direction of the sheets 71 to 82. The capacitor patterns 53*a* and 53*b* are opposed to the open ends of the inductor patterns 47*a* and 48*b* via the sheets 74 and 79 to define a capacitor C3. The capacitor C3 and the inductor L3 having the double structure constitute an LC parallel resonance circuit, that is, define the third stage LC resonator Q3.

The coupling capacitors 54 and 55 are arranged in the rear side of the sheet 77, and are positioned between the inductor patterns 43*b,* 45*b,* and 47*b,* and the inductor patterns 44*a,* 46*a,* and 48*a* in the laminating direction of the sheet 71 to 82, respectively. The coupling capacitor pattern 54 is opposed to the inductor patterns 43*b,* 45*b* and 44*a,* and 46*a* to define a coupling capacitor Cs1. The coupling capacitor pattern 55 is opposed to the inductor patterns 45*b,* 47*b* and 46*a,* and 48*a* to define a coupling capacitor Cs2.

The respective sheets 71 to 82 having the above-described configurations are sequentially stacked, as shown in FIG. 7, joined under pressure, and fired integrally to produce a laminated body 90 shown in FIG. 8. On the right end and left end surfaces of the laminated body 90, an input electrode 91 and an output electrode 92 are provided, respectively. Ground electrodes 93 and 94 are provided on the front-side and back-side surfaces of the laminate 90. To the input electrode 91, the input lead-out patterns 60*a,* 60*b,* 61*a,* and 61*b* are connected. The output lead-out patterns 62*a,* 62*b,* 63*a,* and 63*b* are connected to the output electrode 92. One end of the shield patterns 65 and 66, and one end of the inductor patterns 43*a* to 48*b* are connected, respectively, to the ground electrode 93. The other end of the shield patterns 65 and 66, and one end of the capacitor pattern 51*a* to 53*b* are connected, respectively, to the ground electrode 94.

In the monolithic LC filter 41, the inductors L1 to L3 of the respective LC resonators Q1 to Q3 have a tubular structure. With this configuration, the skin effect for high frequency current is effectively utilized, and moreover, the coupling capacitors does not interrupt a magnetic field generated by the inductors L1 to L3. Hence, the inductors L1 to L3 achieve a very high Q value, respectively, and thereby, the LC filter 41 has excellent band-pass filter characteristics.

The LC filter 41 may have a configuration in which the lamination positions of the capacitor patterns 51*a* to 53*b* constituting the LC resonators Q1 to Q3 and those of the coupling capacitors 54 and 55 are exchanged.

Figure 11:
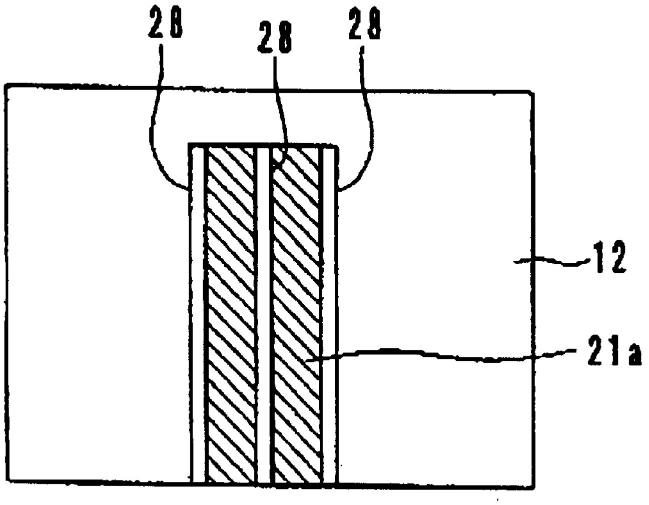
FIG. 11 is a plan view showing a modification example of the via-hole.
Figure 12:
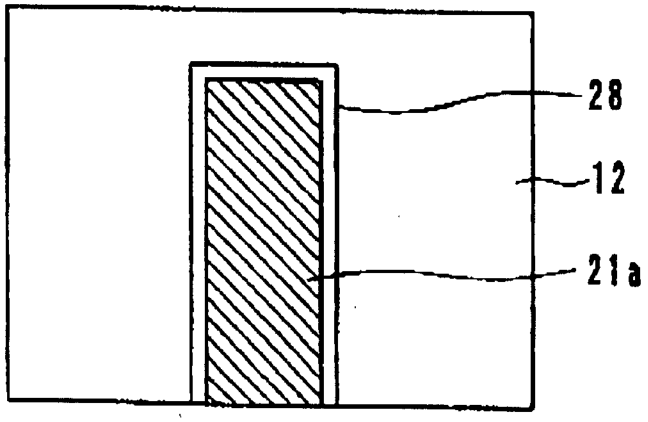
FIG. 12 is a plan view of a further modification example of the via-hole.
Figure 13:
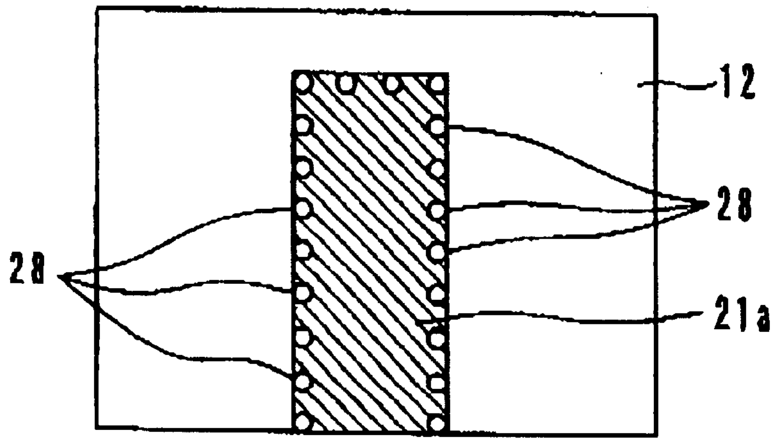
FIG. 13 is a plan view showing still a further modification example of the via-hole.
Figure 14:
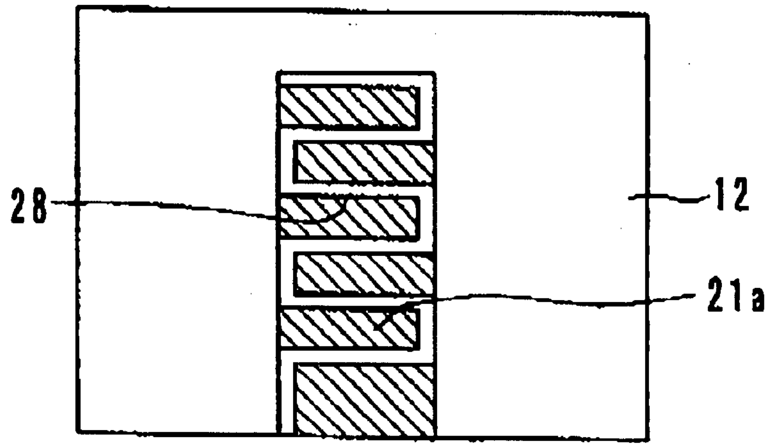
FIG. 14 is a plan view showing another modification example of the via-hole.
Figure 15:
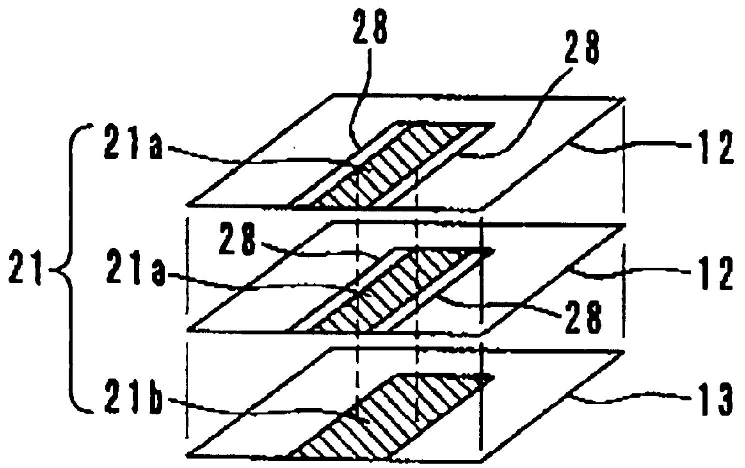
FIG. 15 is an exploded perspective view showing a modification example of the tubular structure.
Figure 16:
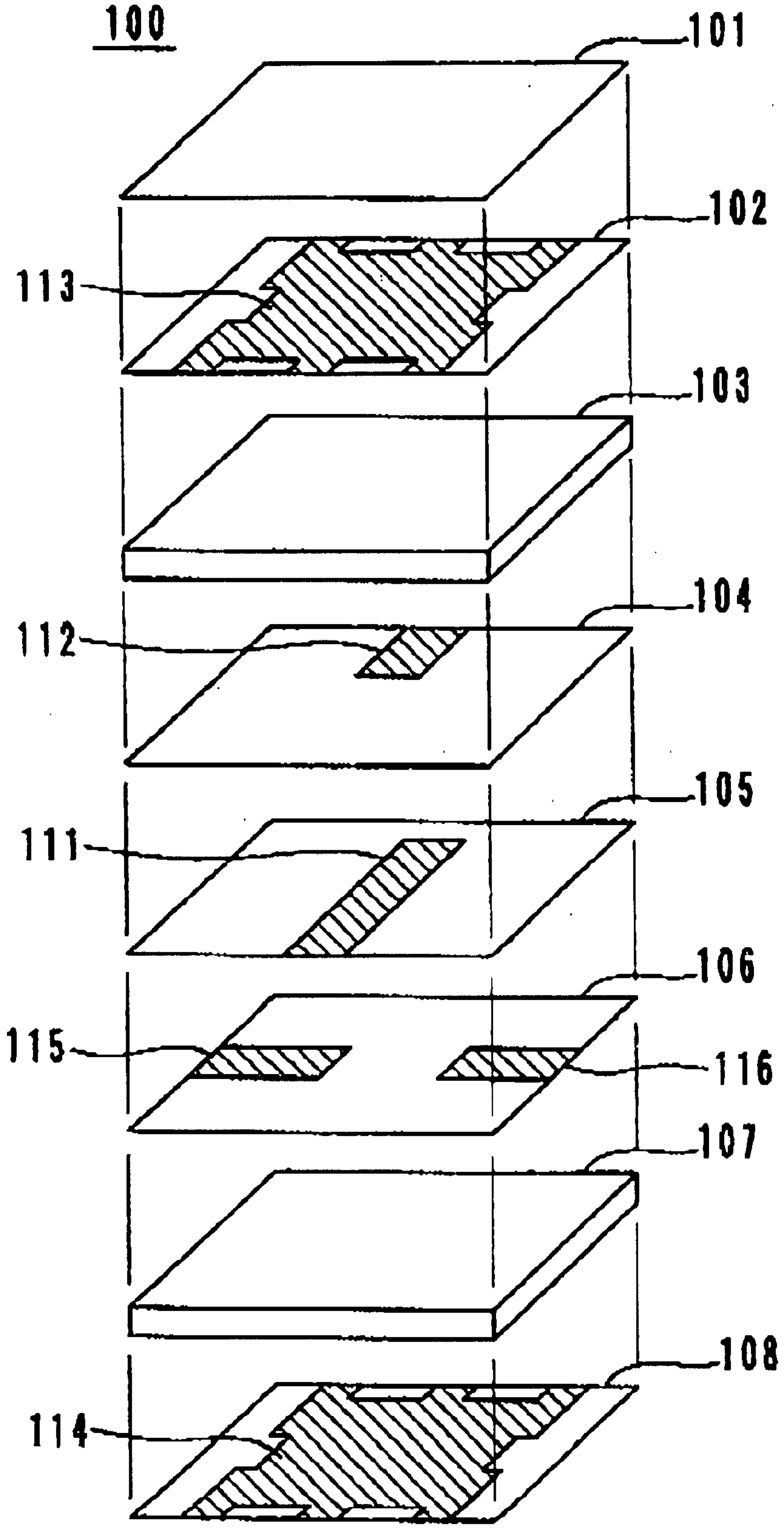
FIG. 16 PRIOR ART
FIG. 16 is an exploded perspective view of a conventional monolithic LC resonator.
Figure 17:
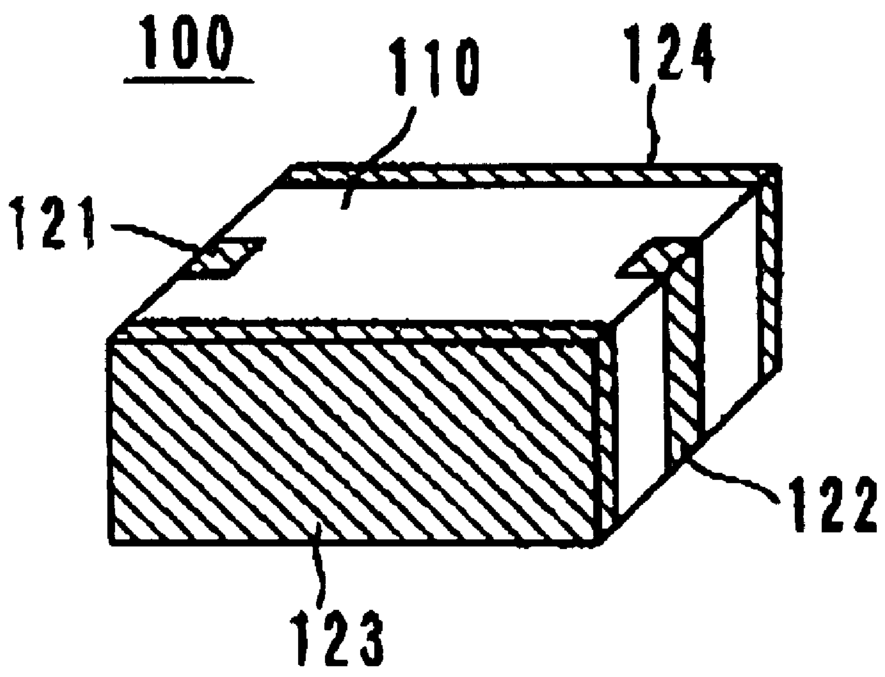
FIG. 17 PRIOR ART
FIG. 17 is a perspective view showing the appearance of the monolithic LC resonator of FIG. 16.

The present invention is not restricted to the above-described preferred embodiments. Various changes and modifications can be made in the invention without departing from the sprit and scope thereof. For example, in the inductors according to the above preferred embodiments, each tubular structure having a substantially rectangular cross-section includes two inductor patterns and two long via-holes. The number and shape of inductor patterns, and those of via-holes are optional. For example, in the first preferred embodiment, as shown in FIG. 11, the inductor pattern 21*a* having three long via-holes 28 may be connected to the inductor pattern 21*b*. Further, as shown in FIG. 12, a long via-hole 28 may extend along the three sides of the inductor pattern 21*a*. Further, as shown in FIG. 13, a plurality of via-holes 28 may be arranged along the three sides of the inductor pattern 21*a*. Further, the via-hole 28 may be meandering as shown in FIG. 14. Moreover, the number of LC filter stages (the number of resonators) is optional. Furthermore, as shown in FIG. 15, one insulation sheet 12 having an inductor pattern 21*a* provided on the surface thereof may be added. That is, three inductor patterns may define the tubular structure.

Further, in the above-described preferred embodiments, the insulation sheets having the patterns formed thereon are stacked, and fired so as to be integrated. The present invention is not restricted to this example. As the insulation sheet, a sheet fired previously may be used. Further, the following production method may be used to define the LC resonator and the LC filter. After an insulation layer is formed from a paste insulation material by a printing method or other suitable process, a paste conductive pattern material is coated on the surface of the insulation layer to form an optional pattern. Subsequently, the paste insulation material is coated so as to cover the pattern, whereby an insulation layer containing the pattern therein is formed. Similarly, the above-described coating is repeated thereon to define an LC resonator or an LC filter each having a lamination structure.

As seen in the above-description, according to various preferred embodiments of the present invention, the inductor preferably includes the plurality of tubular structures. Accordingly, the surface area of the inductor is greatly increased without the thickness of the inductor pattern being increased. The entire inductor having the increased surface area is effectively used as a flow path for high frequency current. Thus, the resistance of the inductor is greatly reduced as compared with that of a conventional inductor, and the Q value of the inductor is greatly increased.

Further, a magnetic field generated with high frequency current flowing through the inductor scarcely passes between the plurality of tubular structures constituting the inductor. Accordingly, the capacitor pattern and the coupling capacitor pattern for capacitance-coupling the resonators arranged between the two adjacent tubular structures in the laminating direction of the laminate do not interrupt the magnetic field of the inductor.

Further, the inductor preferably includes the plurality of tubular structures, and the plurality of tubular structures are laminated through an insulation layer to define a multiple structure, whereby the concentration of a magnetic field, generated in the periphery of the inductor, onto the edges of the inductor pattern is reduced. As a result, a monolithic LC resonator and a monolithic LC filter each having a very high Q value and excellent high-frequency characteristics are provided.

It should be understood that the foregoing description is only illustrative of preferred embodiments of the present invention. Various alternatives and modifications can be devised by those skilled in the art without departing from the present invention. Accordingly, the present invention is intended to embrace all such alternatives, modifications and variations that fall within the scope of the appended claims.

What is claimed is:

1. A monolithic LC resonator comprising:

a laminated body including a plurality of insulation layers, an inductor pattern, and a capacitor pattern laminated together;

an LC resonance circuit provided in the laminated body, which includes an inductor defined by the inductor pattern, and a capacitor defined such that the capacitor pattern is opposed to the inductor pattern with one of the plurality of insulation layers being sandwiched between the capacitor pattern and the inductor pattern;

wherein said inductor of the LC resonance circuit has at least two tubular structures which are laminated to each other via at least one of the plurality of insulation layers, each of the at least two tubular structures includes at least two via-holes and at least two inductor patterns which are electrically connected to each other through said at least two via-holes, the at least two via-holes extending along a length of said inductor pattern, and the capacitor pattern is arranged between the at least two tubular structures of the inductor.

2. A monolithic LC resonator according to claim 1, wherein said laminated body further includes another insulation layer having an input lead-out pattern and an output lead-out pattern provided thereon.

3. A monolithic LC resonator according to claim 2, wherein said input lead-out pattern includes one end which is exposed at one side of said laminated body and the other end being opposed to one of said inductor patterns, and said output lead-out pattern includes one end which is exposed at another side of said laminated body opposite to said one side and the other end being opposed to one of said inductor patterns.

4. A monolithic LC resonator according to claim 1, wherein said inductor patterns are linear inductor patterns having a constant width and provided in an approximate central portion of the insulation layer.

5. A monolithic LC resonator according to claim 1, wherein said inductor patterns are exposed at a front side of said insulation layer.

6. A monolithic LC resonator according to claim 5, wherein said capacitor pattern is exposed at a rear side of said insulation layer opposite to said front side of said insulation layer.

7. A monolithic LC resonator according to claim 1, wherein said via-holes are long openings extending along three sides of said inductor patterns.

8. A monolithic LC resonator according to claim 1, wherein said laminated body further includes additional insulation layers having shield patterns provided thereon.

9. A monolithic LC resonator according to claim 8, wherein said shield patterns have wide patterns arranged to sandwich the inductor patterns and the capacitor pattern therebetween.

10. A monolithic LC resonator according to claim 1, wherein said via-holes includes a plurality of via-holes extending along three sides of said inductor patterns.

11. A monolithic LC filter comprising:

a laminated body including a plurality of insulation layers, a plurality of inductor patterns, and a plurality of capacitor patterns laminated together;

a plurality of LC resonators in the laminated body, which include a plurality of inductors defined by the inductor patterns, and a plurality of capacitors defined by the capacitor patterns such that the capacitor patterns are opposed to the inductor patterns with at least one of the plurality of insulation layers being sandwiched between the capacitor patterns and the inductor patterns;

wherein the inductor of each LC resonator has at least two tubular structures which are laminated to each other through at least one of the plurality of insulation layers, each of the at least two tubular structures includes at least two via-holes and at least two inductor patterns which are electrically connected to each other through said at least two via-holes, the at least two via-holes extending along a length of said plurality of inductor patterns, and at least one of the capacitor patterns and a coupling capacitor pattern for capacitance-coupling the LC resonators is arranged between the at least two tubular structures of the inductor.

12. A monolithic LC filter according to claim 11, wherein said via-holes include long openings that extend along three sides of said at least two inductor patterns.

13. A monolithic LC filter according to claim 11, wherein said via-holes include a plurality of via-holes arranged along three sides of said at least two inductor patterns.

14. A monolithic LC resonator according to claim 11, wherein said laminated body further includes another insulation layer having an input lead-out pattern and an output lead-out pattern provided thereon.

15. A monolithic LC resonator according to claim 14, wherein said input lead-out pattern includes one end which is exposed at one side of said laminated body and the other end being opposed to one of said plurality of inductor patterns, and said output lead-out pattern includes one end which is exposed at another side of said laminated body opposite to said one side and the other end being opposed to one of said plurality of inductor patterns.

16. A monolithic LC filter according to claim 11, wherein said plurality of inductor patterns are linear inductor patterns having a constant width and provided in an approximate central portion of the insulation layers.

17. A monolithic LC resonator according to claim 11, wherein each of said plurality of inductor patterns is exposed at a front side of one of said insulation layers.

18. A monolithic LC resonator according to claim 17, wherein each of said plurality of capacitor pattern is exposed at a rear side of one of said insulation layers opposite to said front side of said insulation layer.

19. A monolithic LC filter according to claim 11, wherein said LC filter is a three-stage LC band-pass filter.

20. A monolithic LC resonator according to claim 11, further including shield patterns having wide patterns arranged to sandwich the plurality of inductor patterns and the plurality of capacitor patterns therebetween.

* * * * *